United States Patent
Fujito et al.

(10) Patent No.: US 7,538,439 B2
(45) Date of Patent: May 26, 2009

(54) MULTI-CHIP SEMICONDUCTOR DEVICE WITH HIGH WITHSTAND VOLTAGE, AND A FABRICATION METHOD OF THE SAME

(75) Inventors: Hiroshi Fujito, Suita (JP); Yasuhiro Takamori, Nishinomiya (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/133,715

(22) Filed: Jun. 5, 2008

(65) Prior Publication Data

US 2008/0246534 A1   Oct. 9, 2008

Related U.S. Application Data

(63) Continuation of application No. 11/378,670, filed on Mar. 17, 2006, now Pat. No. 7,399,660.

(30) Foreign Application Priority Data

Mar. 18, 2005   (JP)   ............... 2005-080527

(51) Int. Cl.
   *H01L 23/52*   (2006.01)
   *H01L 21/44*   (2006.01)
(52) U.S. Cl. ................... 257/777; 438/108
(58) Field of Classification Search ............. 257/678, 257/686, 698, 777; 438/106–111
See application file for complete search history.

(56) References Cited

U.S. PATENT DOCUMENTS

| | | | |
|---|---|---|---|
| 6,410,987 B1 * | 6/2002 | Kanemoto et al. | 257/777 |
| 6,642,610 B2 | 11/2003 | Park et al. | |
| 6,903,455 B2 | 6/2005 | Sohn | |
| 7,399,660 B2 * | 7/2008 | Fujito et al. | 438/108 |

FOREIGN PATENT DOCUMENTS

| | | |
|---|---|---|
| JP | 63-175906 | 7/1988 |
| JP | 2004-103703 | 4/2004 |

* cited by examiner

*Primary Examiner*—Calvin Lee
(74) *Attorney, Agent, or Firm*—Cooper & Durham, LLP

(57) ABSTRACT

A multi-chip semiconductor device includes a substrate, a first semiconductor chip, a second semiconductor chip, and a plastic mold. The first semiconductor chip has a function for executing a predetermined electrical operation and is installed on the substrate. The second semiconductor chip is installed on the first semiconductor chip and is configured to integrate a power circuit to receive an external power supply and to supply an electric power to the first semiconductor chip based on the external power supply. The plastic mold seals together the first and second semiconductor chips on the substrate.

18 Claims, 3 Drawing Sheets

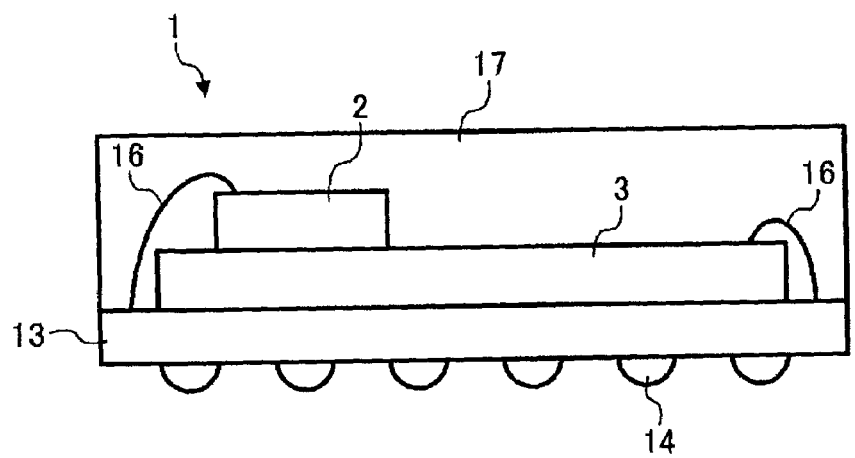
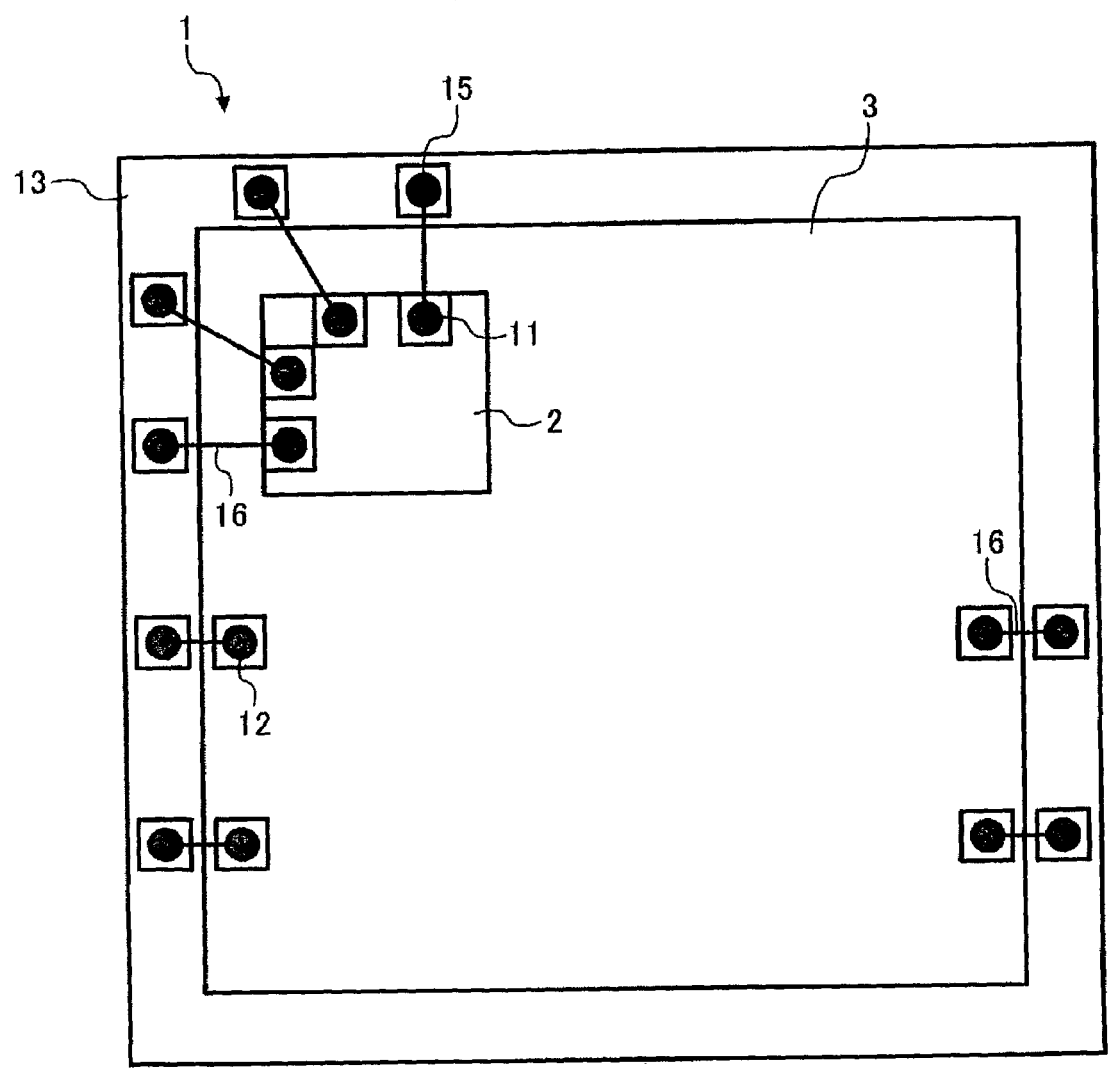

MULTI-CHIP SEMICONDUCTOR DEVICE WITH HIGH WITHSTAND VOLTAGE, AND A FABRICATION METHOD OF THE SAME

CROSS-REFERENCE TO RELATED APPLICATION

This application is a Rule 1.53(b) continuation of Ser. No. 11/378,670, filed Mar. 17, 2006 now U.S. Pat. No. 7,399,660, the entire contents of which are incorporated herein by reference.

FIELD OF THE DISCLOSURE

This patent specification describes a multi-chip semiconductor device, and more particularly a multi-chip semiconductor device with a relatively high withstand voltage against an input voltage, while avoiding a need of increasing a package size. This patent specification further describes a method of fabricating the above-mentioned multi-chip semiconductor device.

BACKGROUND

In general, electronic apparatuses have been subjected to an increasing market demand for smaller size, lower cost, and high versatility at a same time. In order to meet the market demand, design rules for miniaturization of semiconductors have evolved so that a semiconductor can integrate more circuits in a smaller package. However, as miniaturization progressed, a semiconductor fabricated using such a process tends to have a relatively low withstand voltage. This tendency increases a risk of damage to an electronic apparatus due to an overvoltage mistakenly applied to a semiconductor device used in the electronic apparatus. In particular, an electronic apparatus using an AC (alternating current) adaptor faces this risk when an AC adaptor having a relatively high output voltage is mistakenly applied to the apparatus.

It is possible to make a semiconductor device capable of withstanding a relatively high AC voltage by applying a high-voltage fabrication process so as to reduce or eliminate the risk of damage to the semiconductor device due to an inappropriate connection to an AC adaptor having a relatively high AC voltage. However, such a semiconductor made through a high-voltage fabrication process would have a relatively large chip size. Moreover, it would require extra cost and time for developing a new semiconductor.

SUMMARY

In view of the foregoing, this patent specification describes some examples of a novel multi-chip semiconductor device. In one example, a novel multi-chip semiconductor device includes a substrate, a first semiconductor chip, a second semiconductor chip, and a plastic mold. The first semiconductor chip has a function for executing a predetermined electrical operation and is installed on the substrate. The second semiconductor chip is installed on the first semiconductor chip and integrates a power circuit to receive an external power supply and to supply an electric power to the first semiconductor chip based on the external power supply. The plastic mold seals together the first and second semiconductor chips on the substrate.

This patent specification further describes some examples of a novel method for fabricating a multi-chip semiconductor device. In one example, a novel method for fabricating a multi-chip semiconductor device includes providing a first semiconductor chip having a function for executing a predetermined electrical operation and installed on a substrate, and placing a second semiconductor chip on the first semiconductor chip. The second semiconductor chip integrates a power circuit to receive an external power supply and to supply an electric power to the first semiconductor based on the external power supply. The method further includes sealing together the first and second semiconductor chips with a plastic mold on the substrate.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 2A and 2B are illustrations for explaining a structure of the multi-chip semiconductor device of FIG. 1;

DETAILED DESCRIPTION OF PREFERRED EMBODIMENTS

Figure 1:
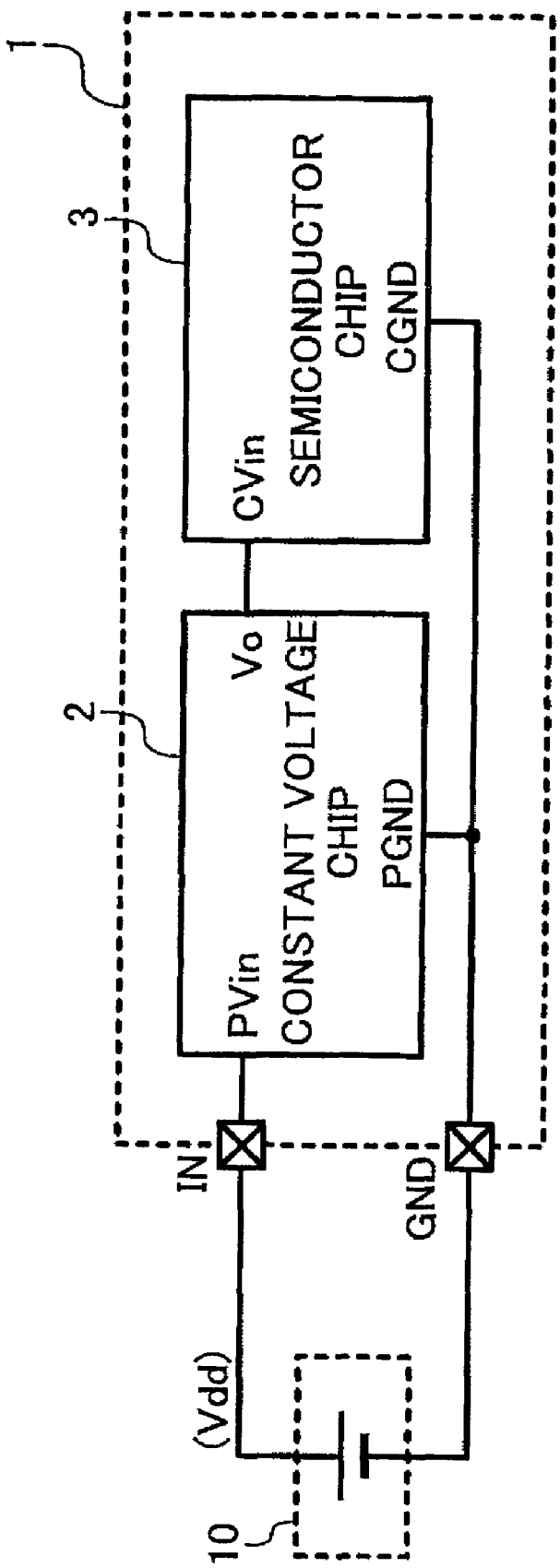
FIG. 1 is a schematic block diagram for a multi-chip semiconductor device according an examples of this disclosure.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referring now to the drawings, wherein like reference numerals designate identical or corresponding parts throughout the several views, particularly to FIG. 1, a multi-chip semiconductor device 1 according to an embodiment is explained. As illustrated in FIG. 1, the multi-chip semiconductor (MCS) device 1 includes a constant voltage chip 2 and a semiconductor chip 3. The constant voltage chip 2 includes an integrated constant voltage power supply circuit or a step-down series regulator and is fabricated through a high voltage process while the semiconductor chip 3 includes a highly integrated multifunctional semiconductor and is fabricated through a low voltage process. The MCS device 1 further includes terminals IN and GND between which an AC (alternating current) adaptor 10 is coupled. The AC adaptor 10 supplies a voltage Vdd to the MCS device 1 through the terminal IN, and the voltage Vdd is input to a terminal PVin of the constant voltage chip 2 in the MCS device 1. In this structure, the semiconductor chip 3 is also referred to hereinafter as a first semiconductor integrated circuit chip and the constant voltage chip 2 is also referred to hereinafter as a second semiconductor integrated circuit chip.

The constant voltage chip 2 steps down the input voltage Vdd to a predetermined voltage within an operating voltage range of the semiconductor chip 3 and outputs the reduced voltage from an output terminal Vo thereof to the semiconductor chip 3 through its input terminal CVin. The semiconductor chip 3 operates by using the voltage supplied by the constant voltage chip 2 as a power voltage. The terminal GND of the MCS device 1 is coupled to a grounding terminal PGND of the constant voltage chip 2 and a grounding terminal CGND of the semiconductor chip 3.

The constant voltage chip 2 is fabricated through the high voltage process, as described above, and has a withstand voltage in the order of 26 volts, for example. Therefore, the constant voltage chip 2 would not cause a malfunction even if it receives the power of the order of 24 volts, for example, from the AC adaptor 10. In contrast, the semiconductor chip 3 is fabricated through the low voltage process, as described above, and has a voltage rating of 5 volts, for example, and a maximum applied voltage of 8 volts, for example.

Further, the constant voltage chip 2 outputs its rated output voltage from the output terminal Vo when the output voltage Vdd of the AC adaptor 10 is greater than the rated output voltage of the constant voltage chip 2. On the other hand, the constant voltage chip 2 outputs a voltage slightly smaller than the output voltage Vdd of the AC adaptor 10 from the output terminal Vo when the output voltage Vdd of the AC adaptor 10 is smaller than the rated output voltage of the constant voltage chip 2.

The rated output voltage of the constant voltage chip 2 is set to a voltage slightly smaller than the maximum applied voltage of the semiconductor chip 3, which is 8 volts, for example, in order to lessen a power consumption in the constant voltage chip 2.

The MCS device 1 is usually applied a voltage of from 6 volts to 7 volts by the AC adaptor 10 to properly function, but can still operate even if it is mistakenly applied a higher voltage, for example, 24 volts.

It should be noted that the constant voltage ship 2 internally includes a transistor for controlling the output voltage and operates with the transistor completely turned on when the output voltage of the AC adaptor 10 is smaller than the rated output voltage (e.g., 6-7 volts) of the constant voltage chip 2. As a result of this, the constant voltage chip 2 has a relatively small power consumption and a minimal heat generation.

As illustrated in FIGS. 2A and 2B, the constant voltage chip 2 has the dimensions of length and breadth substantially smaller than those of the semiconductor chip 3 and is placed on an upper surface of the semiconductor chip 3. The constant voltage chip 2 can be placed at an arbitrary position on the upper surface of the semiconductor chip 3. The constant voltage chip 2 is provided with a plurality of connection pads 11 around a periphery on an upper surface thereof and the semiconductor chip 3 is provided with a plurality of connection pads 12 around a periphery on an upper surface thereof.

As illustrated in FIGS. 1A and 1B, the MCS device 1 further includes a substrate 13 which includes a plurality of connection terminals 14 and a plurality of lands 15. The plurality of connection terminals 14 are to be coupled to an external substrate, and the plurality of lands 15 are to be coupled to the constant voltage chip 2 and the semiconductor chip 3. The plurality of connection terminals 14 and the plurality of lands 15 form corresponding sets, and each of these corresponding sets is electrically connected with a wiring pattern (not shown) provided to the substrate 13. Each of the plurality of connection pads 11 of the constant voltage chip 2 is connected to a corresponding one of the plurality of lands 15 on the substrate 13 with a bonding wire 16. Also, each of the plurality of connection pads 12 of the semiconductor chip 3 is connected to a corresponding one of the plurality of lands 15 on the substrate 13 with the bonding wire 16. In addition, the semiconductor chip 3 placed on the substrate 13, the constant voltage chip 2 placed on the semiconductor chip 3, and the bonding wires 16 are molded with a sealing resin 17.

Since the constant voltage chip 2 occasionally produces heat, this chip is preferably placed at a position on the upper surface of the semiconductor chip 3, where the semiconductor chip 3 has a circuit producing a relatively small amount of heat when operating. Thus, it becomes possible to avoid a conversion of heat produced by the constant voltage chip 2 and the semiconductor chip 3 at one spot. Further, by thus placing the constant voltage chip 2 on such a relatively low temperature dependent circuit of the semiconductor chip 3, it becomes possible to prevent a deterioration of various properties due to variations of temperature.

Further, in a case the semiconductor chip 3 includes analog and digital circuit portions, the constant voltage chip 2 is preferably placed above the digital circuit portion at a position on the upper surface of the semiconductor chip 3. This structure lessens a generation of a mechanical stress from a stacking of the constant voltage chip 2 on the semiconductor chip 3. As a consequence, it becomes possible to prevent an adverse effect of the mechanical stress on the properties of the semiconductor chip 3.

Furthermore, in some cases, the semiconductor chip 3 includes optional circuits which can selectively be activated and some of which are not selected according to a design specification. That is, these optional circuits which are not selected are inoperable. The constant voltage chip 2 is preferably placed above the inoperable optional circuits among the entire optional circuits at a position on the upper surface of the semiconductor chip 3. This structure minimizes an adverse effect of heat and mechanical stresses.

Figure 3:
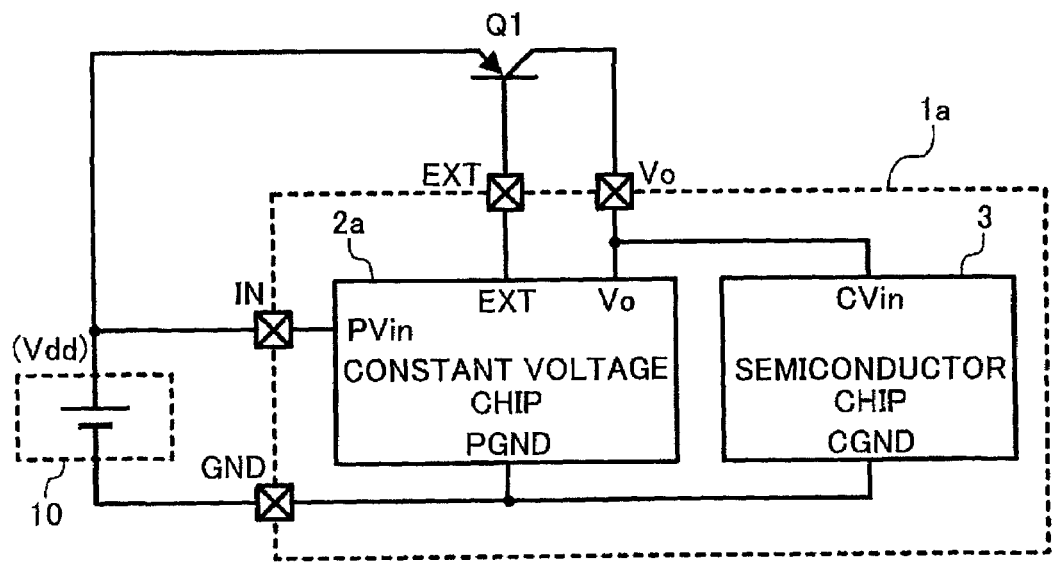
FIG. 3 is a schematic block diagram for a multi-chip semiconductor device according to another example.

Referring to FIG. 3, a multi-chip semiconductor (MCS) device 1a according to another embodiment is explained. As illustrated in FIG. 3, the MCS device 1a is similar to the MCS device 1 of FIG. 1, except for a constant voltage chip 2a and a transistor Q1 which is externally coupled to the MCS device 1a. This structure is aimed to reduce a size and a heat amount of the multi-chip semiconductor.

More specifically, a function for controlling an output voltage included in the constant voltage chip 2 of FIG. 1 is cut off and is externally provided as a transistor Q1 to the multi-chip semiconductor device. That is, the constant voltage chip 2a maintains a function for outputting a voltage but has no function for controlling an output voltage. In this connection, the constant voltage chip 2a includes an output terminal EXT to output a voltage and an input terminal Vo. Accordingly, the MCS device 1a further includes a terminal EXT and a terminal Vo. The output terminal EXT of the constant voltage chip 2a is coupled to a base of the transistor Q1 via the terminal EXT of the MSC device 1a. Also, the input terminal Vo of the constant voltage chip 2a is connected to an emitter of the transistor Q1 via the terminal Vo of the MCS device 1a. In the MCS device 1a, the input terminal Vo of the constant voltage chip 2a is coupled to the input terminal CVin of the semiconductor chip 3.

With this structure, the constant voltage chip 2a can be made smaller and accordingly generate a smaller amount of heat in operation. Consequently, it becomes possible to determine a position of the constant voltage chip 2a on the semiconductor chip 3, which design is referred to as a chip-on-chip design, in a more free and suitable manner.

Figure 4:
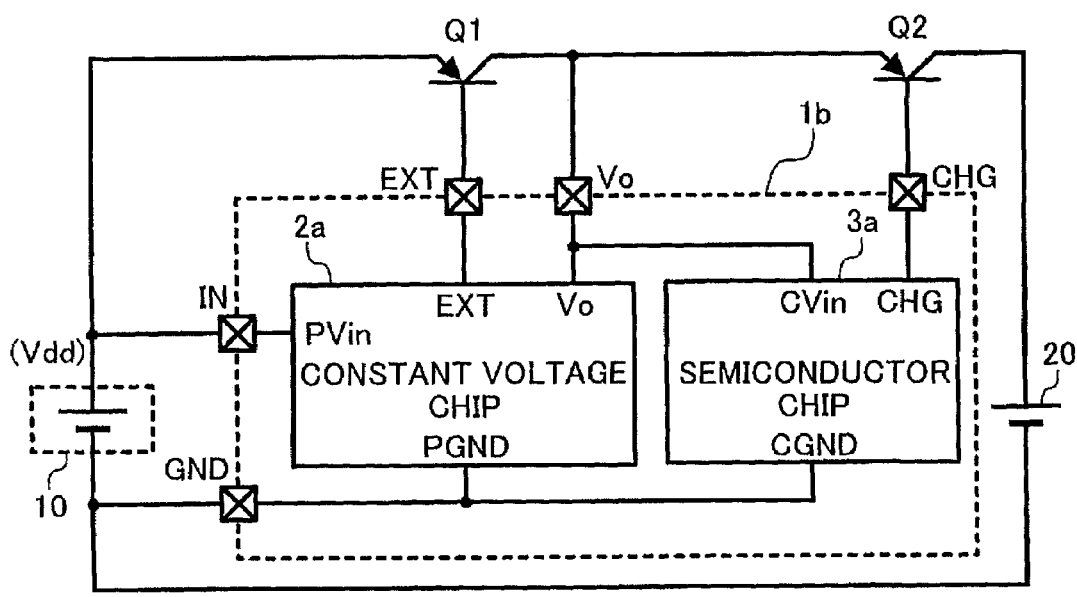
FIG. 4 is a schematic block diagram for a multi-chip semiconductor device according to another example.

Referring to FIG. 4, a multi-chip semiconductor (MCS) device 1b according to another embodiment is explained. As illustrated in FIG. 4, the MCS device 1b is similar to the MCS device 1a of FIG. 3, except for a semiconductor device 3a and a transistor Q2 which is externally coupled to the MCS device 1b. This structure is aimed to further reduce a size and a heat amount of the multi-chip semiconductor in a case a secondary battery is needed to the semiconductor chip of the MSC device.

More specifically, a function for supplying a power current to an external secondary battery 20 to be included in the constant voltage chip is cut off and is externally provided as a power transistor Q2 to the multi-chip semiconductor device. That is, the semiconductor chip 3a includes a secondary battery controller having a function for controlling the external power transistor Q2 to externally supply the power current to the power transistor Q2 but has no function for directly supplying a power current. In this connection, the semiconductor chip 3a includes an output terminal CHG to output a control signal, and the MCS device 1b further includes a terminal CHG. The output terminal CHG is connected to a base of the power transistor Q2 via the terminal CHG of the MCS device 1b.

With this structure, the semiconductor chip 3a can be made smaller and accordingly generate a smaller amount of heat in operation. In addition, an extra heat sink material may not be needed.

In this way as described above, the multi-chip semiconductor devices according to the embodiments are designed to have a structure in which a constant voltage chip and a semiconductor chip are together integrated in one package. This aims to avoid an undesired direct input of high voltage to the semiconductor chip when the package is mistakenly connected to a high-voltage-output AC adaptor, thereby preventing the semiconductor chip from becoming defective. Furthermore, by applying the chip-on-chip design, the present embodiment can make a semiconductor device with a relatively high withstand voltage without an increase of an installation area for the package of the semiconductor device. In addition, it is possible to use general purposed semiconductor chips for both the constant voltage chip and the semiconductor chip to be packaged in the MCS device and therefore no extra development expense nor time is needed. As a result, a desired semiconductor package can be fabricated at an inexpensive cost and in a relatively short lead time.

Numerous additional modifications and variations are possible in light of the above teachings. It is therefore to be understood that within the scope of the appended claims, the contents of this patent specification may be practiced otherwise than as specifically described herein. For example, elements and/or features of different illustrative embodiments may be combined with each other and/or substituted for each other within the scope of this disclosure and appended claims.

This patent specification is based on Japanese patent application, No. JPAP2005-080527 filed on Mar. 18, 2005 in the Japan Patent Office, the entire contents of which are incorporated by reference herein.

What is claimed is:

1. A semiconductor device comprising:
a first semiconductor chip over a substrate and having a function for executing a predetermined electrical operation; and
a second semiconductor chip installed on the first semiconductor chip and configured to integrate a power circuit to receive an external power supply and to supply power to the first semiconductor chip based on the external power supply.

2. The semiconductor device of claim 1, wherein said second semiconductor chip is a constant voltage chip fabricated through a high-voltage process.

3. The semiconductor device of claim 2, wherein said power circuit integrated in said second semiconductor chip includes a constant voltage power supply circuit.

4. The semiconductor device of claim 2, wherein said power circuit integrated in said second semiconductor chip steps down an input voltage supplied by said external power supply, to a reduced voltage within an operating voltage range of said first semiconductor chip.

5. The semiconductor device of claim 1, wherein an output voltage of said second semiconductor chip is controlled based on an externally supplied voltage received through an input terminal of the second semiconductor chip.

6. The semiconductor device of claim 5, wherein said first semiconductor chip outputs a control signal to an external circuit for supplying said externally supplied voltage received to the second semiconductor chip.

7. The semiconductor device of claim 1, wherein said second semiconductor chip is installed on an upper surface of said first semiconductor chip.

8. The semiconductor device of claim 1, further comprising a substrate including a plurality of lands, wherein said second semiconductor chip includes a plurality of connection pads around a periphery on an upper surface of said second semiconductor chip, and each of the connection pads of the second semiconductor chip is connected through a bonding wire to a corresponding one of the lands on the substrate.

9. The semiconductor device of claim 1, further comprising a substrate including a plurality of lands, wherein said first semiconductor chip is installed on said substrate, and wherein said first semiconductor chip includes a plurality of connection pads around a periphery on an upper surface of said first semiconductor chip, and each of the connection pads of the first semiconductor chip is connected through a bonding wire to a corresponding one of the lands on the substrate.

10. The semiconductor device of claim 1, wherein said first semiconductor chip is a multi-functional semiconductor fabricated through a low-voltage process.

11. An electronic apparatus comprising:
a power source; and
a multi-chip semiconductor device including a substrate, a first semiconductor chip over said substrate and having a function for executing a predetermined electrical operation, and a second semiconductor chip installed on the first semiconductor chip and configured to integrate a power circuit to receive a power supply voltage from said power source and to supply a reduced voltage to the first semiconductor chip.

12. The electronic apparatus of claim 11, wherein said power circuit integrated in said second semiconductor chip includes a constant voltage power supply circuit.

13. The electronic apparatus of claim 11, wherein said power circuit integrated in said second semiconductor chip steps down an input voltage supplied by said external power supply, to a reduced voltage within an operating voltage range of said first semiconductor chip.

14. The electronic apparatus of claim 11, wherein an output voltage of said second semiconductor chip is controlled based on an externally supplied voltage received through an input terminal of the second semiconductor chip.

15. The electronic apparatus of claim 14, wherein said first semiconductor chip outputs a control signal to an external circuit for supplying said externally supplied voltage received to the second semiconductor chip.

16. The electronic apparatus of claim 11, wherein said second semiconductor chip is installed on an upper surface of said first semiconductor chip.

17. The electronic apparatus of claim 11, wherein said substrate includes a plurality of lands, said second semiconductor chip includes a plurality of connection pads around a periphery on an upper surface of said second semiconductor chip, and each of the connection pads of the second semiconductor chip is connected through a bonding wire to a corresponding one of the lands on the substrate.

18. The electronic apparatus of claim 11, wherein said substrate includes a plurality of lands, said first semiconductor chip is installed on said substrate, and said first semiconductor chip includes a plurality of connection pads around a periphery on an upper surface of said first semiconductor chip, and each of the connection pads of the first semiconductor chip is connected through a bonding wire to a corresponding one of the lands on the substrate.

* * * * *